(12) United States Patent
Lee

(10) Patent No.: US 6,475,906 B1
(45) Date of Patent: Nov. 5, 2002

(54) GATE CONTACT ETCH SEQUENCE AND PLASMA DOPING METHOD FOR SUB-150 NM DT-BASED DRAM DEVICES

(75) Inventor: Brian Lee, Hsin Chu (TW)

(73) Assignee: ProMOS Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/898,125

(22) Filed: Jul. 5, 2001

(51) Int. Cl.[7] ................. H01L 21/4763; H01L 21/20
(52) U.S. Cl. ................ 438/637; 438/637; 438/238; 438/256; 438/396; 438/399
(58) Field of Search ................. 438/637–640, 438/3, 238–240, 250–256, 381, 393–399

(56) References Cited

U.S. PATENT DOCUMENTS

| | | | |
|---|---|---|---|
| 4,912,065 A | 3/1990 | Mizuno et al. | |
| 5,292,677 A | 3/1994 | Dennison | |
| 5,718,800 A | 2/1998 | Juengling | 156/643.1 |
| 5,792,681 A * | 8/1998 | Chang et al. | 438/210 |
| 5,965,035 A | 10/1999 | Hung et al. | 216/72 |
| 6,001,717 A * | 12/1999 | Lien | 438/586 |
| 6,008,104 A | 12/1999 | Schrems | 438/386 |
| 6,080,662 A * | 6/2000 | Chen et al. | 438/637 |
| 6,133,153 A | 10/2000 | Marquez et al. | 438/706 |
| 6,136,643 A | 10/2000 | Jeng et al. | 438/253 |
| 6,268,278 B1 * | 7/2001 | Eimori et al. | 438/586 |
| 6,342,416 B1 * | 1/2002 | Kim et al. | 438/238 |
| 6,350,642 B1 * | 2/2002 | Lee et al. | 438/238 |
| 6,353,269 B1 * | 3/2002 | Huang | 438/241 |
| 6,376,304 B1 * | 4/2002 | Matsuoka et al. | 438/244 |

* cited by examiner

*Primary Examiner*—Tuan H. Nguyen
*Assistant Examiner*—Thanh Nguyen
(74) *Attorney, Agent, or Firm*—George O. Saile; Stephen B. Ackerman; Rosemary L. S. Pike

(57) ABSTRACT

An improved etch sequence and an improved integration scheme of plasma doping in the fabrication of a DRAM integrated circuit device are described. Semiconductor device structures are provided in and on a substrate wherein the substrate is divided into an array area and a periphery area. The semiconductor device structures are covered with a dielectric layer. The dielectric layer is concurrently etched through in the array area to form bit line contact openings and in the periphery area to form substrate contact openings. Doped regions are formed in the substrate exposed within the bit line contact openings and the substrate contact openings using a plasma doping process. Next, the dielectric layer is etched through to form a gate contact opening. Thereafter, the bit line contact openings, the substrate contact openings, and the gate contact opening are filled with a conducting layer to complete forming contacts in the fabrication of a DRAM integrated circuit.

25 Claims, 8 Drawing Sheets

GATE CONTACT ETCH SEQUENCE AND PLASMA DOPING METHOD FOR SUB-150 NM DT-BASED DRAM DEVICES

BACKGROUND OF THE INVENTION (1) Field of the Invention

The present invention relates to the fabrication of integrated circuit devices, and more particularly, to a method of fabricating deep trench DRAM devices in the fabrication of integrated circuits.

(2) Description of the Prior Art

In the fabrication of integrated circuit devices, deep trench (DT)-based dynamic random access memory (DRAM) devices require certain integration practices. It has been customary to separate the contact etches in the array area from the contact etches in the periphery. Different fill materials (polysilicon in the contact area and tungsten silicide in the periphery, for example) and different contact methods (diffusion contact in the array area and implant contact in the periphery) are reasons for the separation. However, in DRAM devices with a design rule of less than 150 nm, a low resistivity material is required for a contact, especially for those using a deep trench as a storage node. Thus, polysilicon is no longer an attractive option for the contact in the array area because of its high resistivity.

It has also been customary to combine the contact to junctions of support (CS) etch with the contact to gate (CG) etch because of their close proximity in the support (or periphery) area. For example, a self-aligned contact (SAC) process has been used for the bit line contact (CB) etch in the array area while the contact to substrate and the gate contact etch in the array area have been etched together with a moderate selectivity (<3:1) etch method. The moderate etch selectivity recipe has been chosen partly because it must etch through a nitride capping layer on top of the gate. However, this moderate etching selectivity, especially of oxide to nitride, puts the future manufacturing process in jeopardy due to insufficient overlay control between the gate and the contact to the substrate (CS) in the periphery. Overlay control becomes more difficult as the ground rule (or critical dimension of the gate) shrinks especially for those devices having a ground rule of less than 0.17 æm. The protection becomes even weaker with insufficient selectivity. A proximity of the contact to substrate (especially an NMOS contact) to the gate contact is a dangerous event. Deleterious effects such as shorting of the gate contact to the metal line, threshold voltage roll-off (lowering of the threshold voltage as gate length decreases), junction leakage, and lowering of the effective saturation current can result. This is especially true for implanted junctions.

A number of patents have addressed aspects of DRAM fabrication. U.S. Pat. No. 5,292,677 to Dennison discloses a single etch stop layer for all contacts wherein all contacts are opened together. U.S. Pat. No. 5,718,800 to Juengling teaches selective contact etching using two masks. U.S. Pat. No. 6,136,643 to Jeng et al etches contact openings using nitride/oxide selectivity. U.S. Pat. No. 6,008,104 to Schrems shows a DRAM process with several selective etches. Self-aligned contact etches are taught, for example, in U.S. Pat. Nos. 6,133,153 to Marquez et al and 5,965,035 to Hung et al. U.S. Pat. No. 4,912,065 to Mizuno et al shows a plasma doping process.

SUMMARY OF THE INVENTION

Accordingly, it is a primary object of the present invention to provide an effective and very manufacturable method of DRAM formation in the fabrication of integrated circuits.

It is a further object of the invention to provide an improved etch sequence for DRAM device fabrication.

Another object of the invention is to provide an improved integration scheme of plasma doping in the fabrication of a DRAM integrated circuit device.

Yet another object of the invention is to provide an improved etch sequence and an improved integration scheme of plasma doping in the fabrication of a DRAM integrated circuit device.

In accordance with the objects of the invention, an improved etch sequence and an improved integration scheme of plasma doping in the fabrication of a DRAM integrated circuit device are achieved. Semiconductor device structures are provided in and on a substrate wherein the substrate is divided into an array area and a periphery area. The semiconductor device structures are covered with a dielectric layer. The dielectric layer is concurrently etched through in the array area to form bit line contact openings and in the periphery area to form substrate contact openings. Doped regions are formed in the substrate exposed within the bit line contact openings and the substrate contact openings using a plasma doping process with a separate blocking mask, respectively. Next, the dielectric layer is etched through to form a gate contact opening. Thereafter, the bit line contact openings, the substrate contact openings, and the gate contact opening are filled with a conducting layer to complete forming contacts in the fabrication of a DRAM integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention provides an improved etch sequence and an improved integration scheme of plasma doping in the fabrication of DRAM integrated circuit devices. The method of the present invention is particularly useful for deep trench DRAM devices. However, it will be understood by those skilled in the art that the process of the present invention should not be limited to the application herein illustrated, but can be applied and extended to other applications, including, for example, ferro-electric RAM (FeRAM) or magnetic RAM (MRAM).

Figure 1:
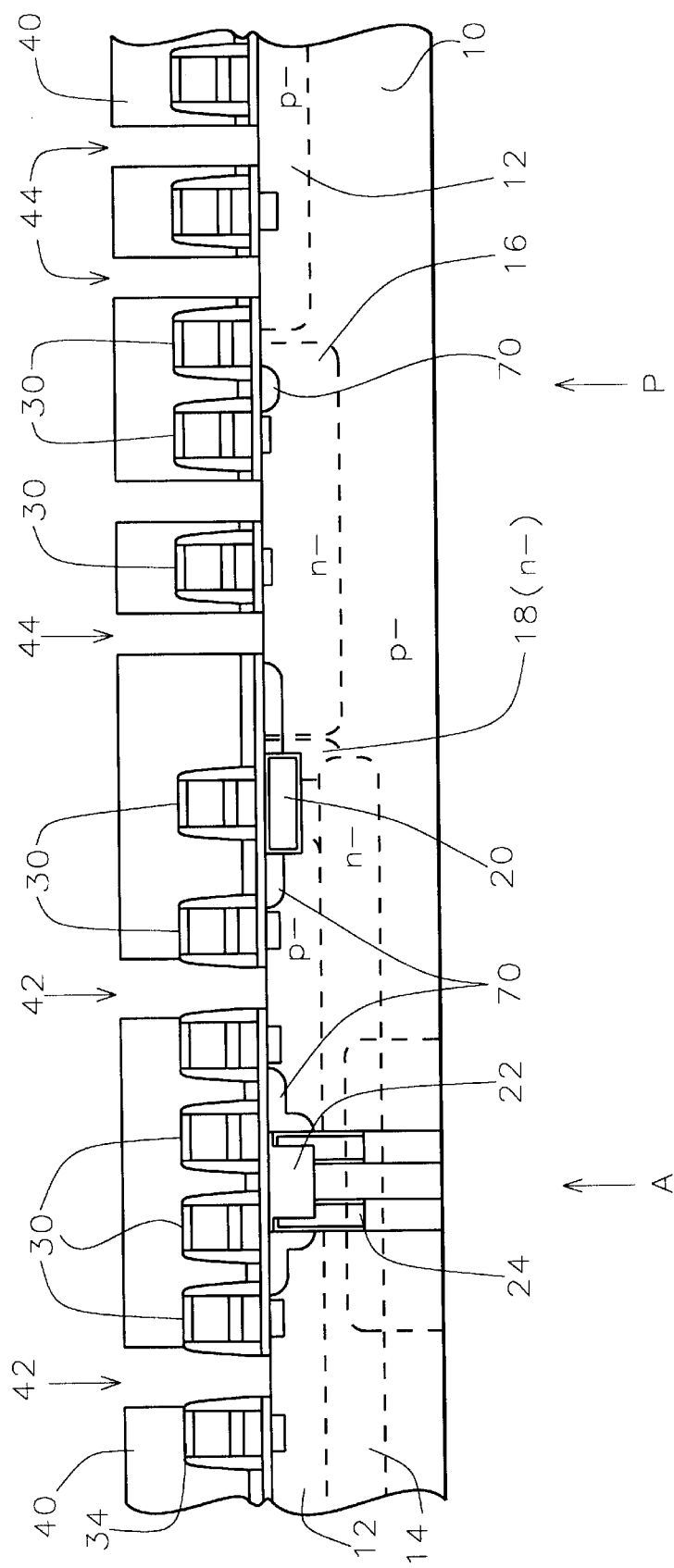
FIGS. 1 through 10 are cross-sectional representations of a preferred embodiment of the present invention.

Referring now more particularly to FIG. 1, there is shown a semiconductor substrate 10. P-well 12, N-wells 16 and 18, and buried plate connector 14 have been formed within the substrate. Deep trench capacitor 24 has been formed partially underlying shallow trench isolation 22. Gate electrodes and interconnection lines 30 have been formed overlying the semiconductor substrate. A capping layer 34 covers the gate electrodes and interconnection lines and the substrate between the lines. The capping layer may be a nitride layer such as silicon nitride or silicon oxynitride having a thickness of between about 300 and 500 Angstroms.

Inter-layer dielectric layer 40 is blanket deposited over the semiconductor device structures. This layer may comprise silicon dioxide, borophospho-tetraethoxysilane (BP-TEOS) oxide, borophosphosilicate glass (BPSG), phosphosilicate glass (PSG), or a combination of BPSG and silicon dioxide, and so on, and may be one or more layers. The total thickness of the layer 40 is between about 6000 and 10,000

Angstroms. The top of the inter-layer dielectric layer 20 may be planarized, for example by reflowing of the dielectric material, etchback, or chemical mechanical polishing (CMP), or the like.

The improved etch sequence of the present invention involves first etching the bit line contacts (CB) in the array area and the contacts to substrate (CS) in the periphery area together using a SAC process. Next, the gate contact etch is performed. With this method, both CB and CS will be protected from misalignment between the contact holes and the gate, making the device more robust after junction and contact implantation. The dedicated contact to gate (CG) etch allows this etching to be fully optimized by preventing excessive etching through the gate silicide layer and by allowing a wider contact area. The new scheme does not require new etching tools or processes, but does need a new mask design and may require an additional i-line blocking mask for contact implantation for an implanted contact formation scheme for independently optimized CB, CSN, and CSP contacts. The new mask design cost will be compensated for by a higher yield, device performance, and functionality. The resulting device will have a steady threshold voltage control, a lower sub-threshold voltage current, and a higher saturation current. The new method will also extend the current design lifetime by effectively making the junction stable in a controlled manner.

Array area A is shown on the left side of FIG. 1, and periphery area P is shown on the right side. In the process of the present invention, the bit line contacts 42 in the array area and the contacts to the substrate 44 in the periphery area are opened together using a self-aligned contact etch that is selective to oxide with respect to nitride.

Figure 2:
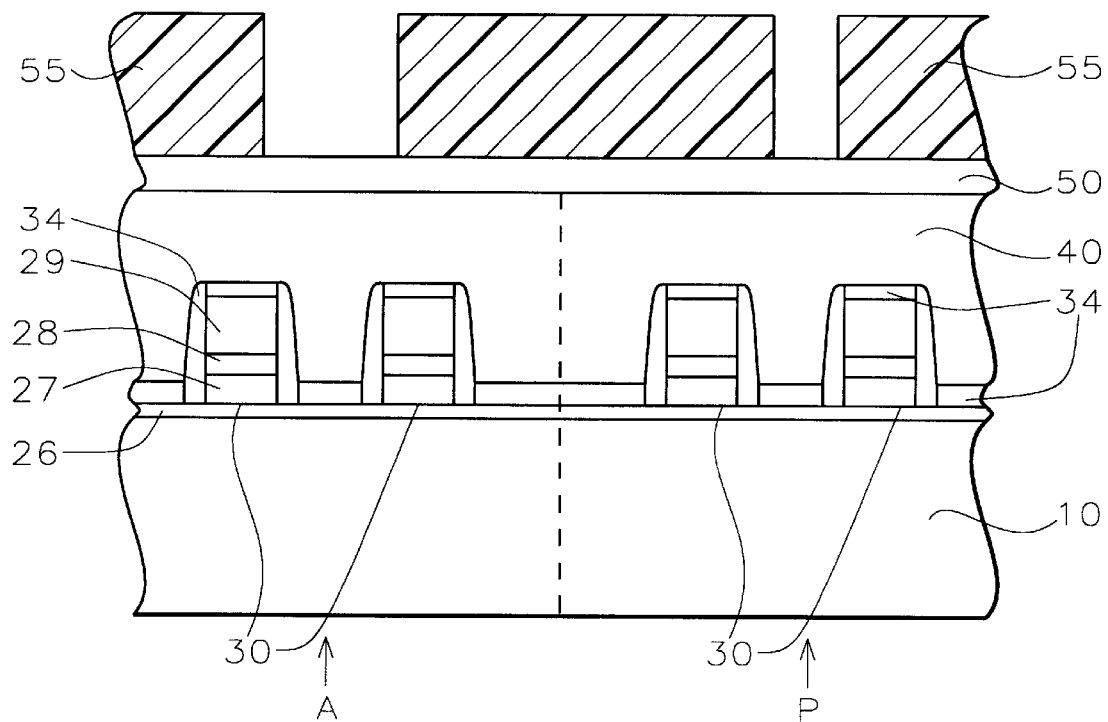

FIG. 2 is an enlarged illustration of a portion of the integrated circuit device. Two gate electrodes 30 in the array area A are shown on the left side of the figure and two gate electrodes 30 in the periphery area P are shown on the right side. For example, the gate electrodes 30 are formed overlying a gate oxide layer 26. The gate electrodes may comprise a first polysilicon layer 27 having a thickness of between about 800 and 1200 Angstroms, a second silicide layer 28 such as tungsten silicide having a thickness of between about 650 and 800 Angstroms, and a third nitride layer 29 such as silicon nitride having a thickness of between about 1600 and 2000 Angstroms. Capping nitride layer 34 covers the top side surfaces of the gates 30 and the gate oxide surfaces. Source/drain regions 70 are formed by doping with arsenic or phosphorus at a dosage of greater than $5 E 14$ ions/cm$^2$ and an energy of less than 25 KeV. The interlayer dielectric layer 40 has a thickness over the gates 30 of between about 3250 and 6000 Angstroms.

Now, an anti-reflective coating (ARC) layer 50 may be deposited over the planarized interlayer dielectric layer 40. For example, the ARC layer may comprise an organic ARC or a dielectric ARC such as silicon oxynitride having a thickness of between about 600 and 1200 Angstroms.

Now, a photoresist mask 55 is formed over the surface of the wafer. The mask has openings for the CB and CS contact openings. A SAC etch is performed concurrently for the bit line contact openings in the array area A and the contacts to the substrate in the periphery area P.

Figure 3:
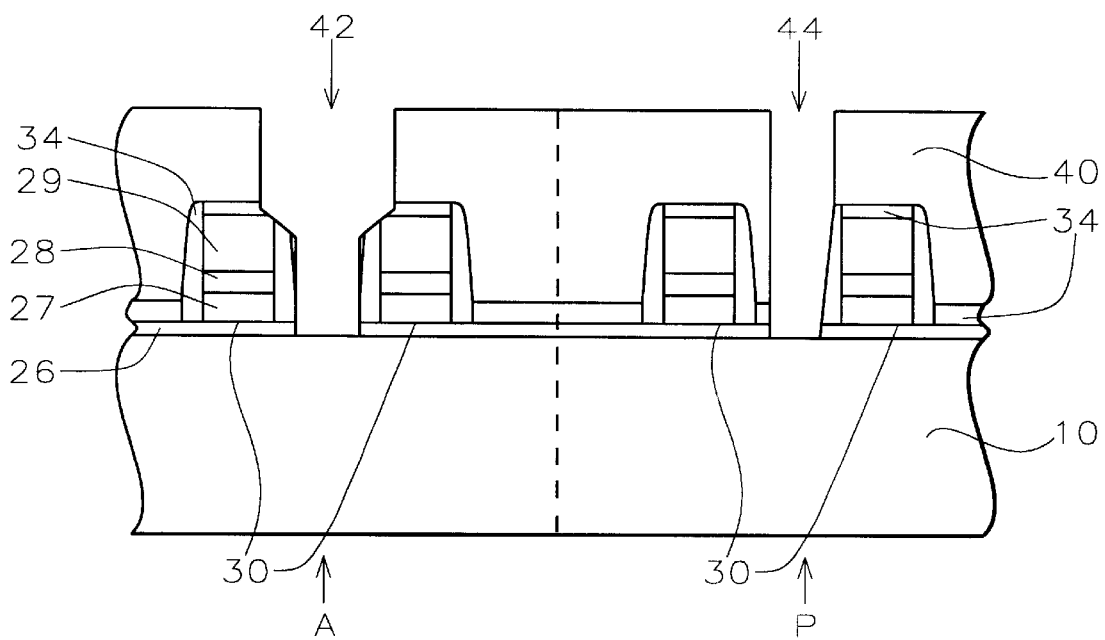

FIG. 3 illustrates a CB contact opening 42 and a CS contact opening 44. The preferred SAC etching recipe for the combined CB and CS etch consists of etching with C4F8 and CO gases or with C5F8 gas with a selectivity of oxide with respect to nitride of more than 10 to 1. The second etching step is an over etch step that etches through the nitride layer 34 overlying the substrate within the contact opening. This etch should be performed with a corner selectivity of oxide with respect to nitride of more than 15:1. For example, a low oxygen partial pressure over etch may be used with low power and low pressure with gas chemistry optimized to achieve the desired corner selectivity.

Figure 4:
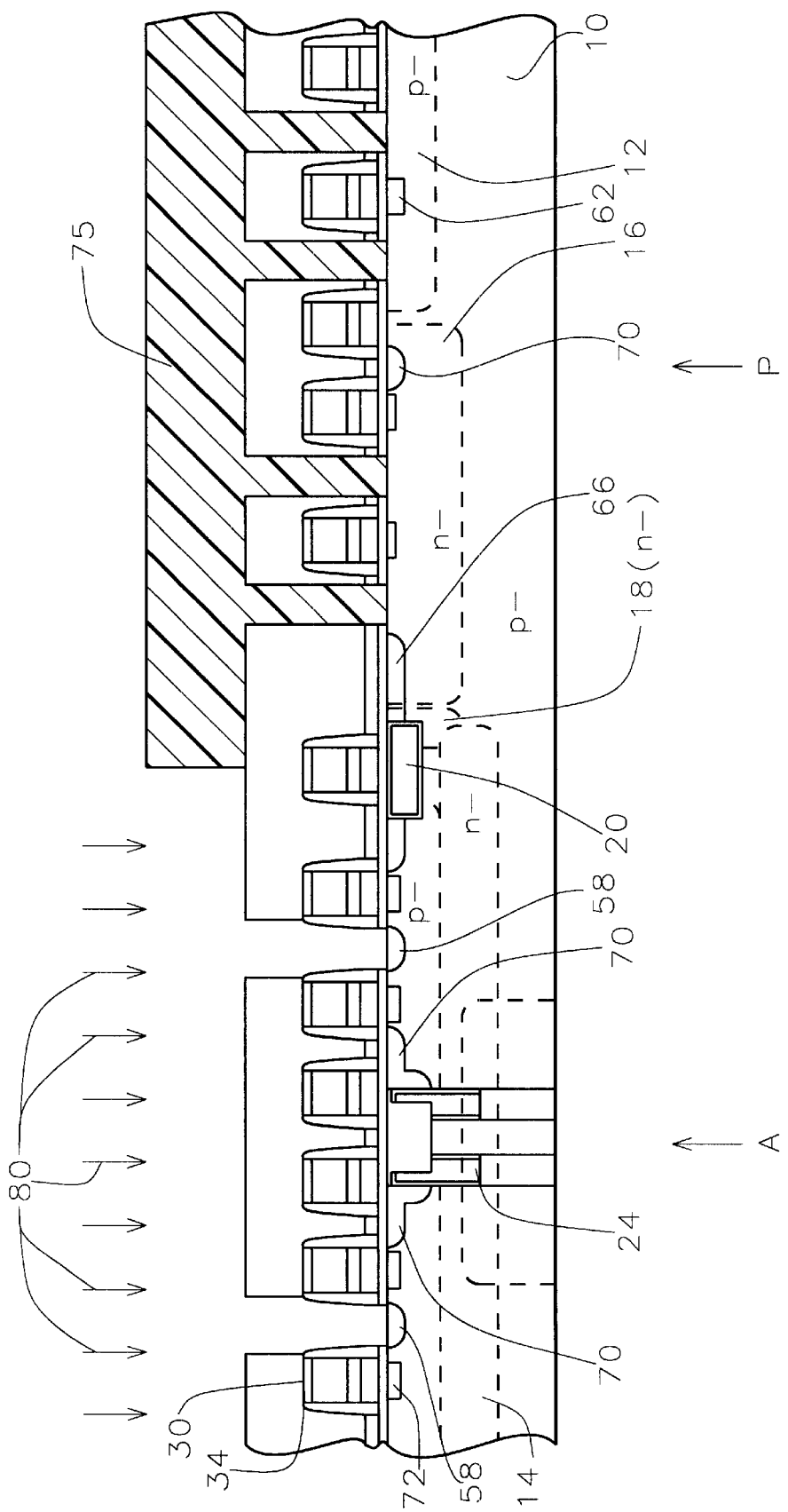

Returning now to the larger portion of the wafer shown in FIG. 4, the CB 42 and CS 44 have been opened as described above. Now contact implantation is to be performed. A deeper junction is required at the contact than for the source/drain junction. For example, twice the energy and five times the dosage may be required for the contact over the S/D junction implantation. For low resistivity, a high dosage implantation is required to form an Ohmic contact. Lateral diffusion is minimized so as not to adversely impact drain engineering. High energy will jeopardize the device, so in this contact implantation step, a low energy implantation is desirable. However, the low energy implantation will reduce throughput requiring a long process time to achieve the high dose.

The process of the present invention includes a new integration scheme of plasma doping for DRAM contact formation. In plasma doping, the throughput at a low energy implantation is not limited by space charge limitation, but it is rather controlled by duty cycle (pulse length times repetition rate) and plasma density. The independent control of throughput (time averaged current density) from the energy makes the plasma doping work for low energy and high dosage application. Pulse engineering can be used rather than continuous; segment voltage with pulses for better controllability. No channeling is found in plasma doping, resulting in shallow junctions.

Now the contact implantation of the present invention will be described in reference to FIG. 4. In a first step, a mask 75 covers the periphery area and exposes the array area A. Plasma doping 80 is performed. A plasma of a gas species containing dopant ions is generated. The dosage is controlled by pulse engineering with a duty factor of between about 0.01% and 10%. Low energy of between about 100 eV and 10 KeV is used with an independent substrate bias. The plasma doping process is a low temperature and low power process; therefore, no extra cooling of the silicon substrate is needed in most operating ranges. The temperature is between about 25 and 100 oC and time averaged power on the substrate is between about 10 and 300 watts. A very high surface concentration of dopant is found after plasma doping, higher than the solid solubility limit which is ideal for ultra shallow junctions. The plasma doping process of the present invention has a high throughput of between about 60 and 100 wafers per hour as compared with a conventional ion implantation process throughput of between about 1 and 10 wafers per hour. Plasma doping with arsenic or phosphorus at a dosage of greater than $1 E 15$ ions/cm$^2$ and an energy of less than 10 KeV is performed to fabricate NFET contact junctions 58.

Figure 5:
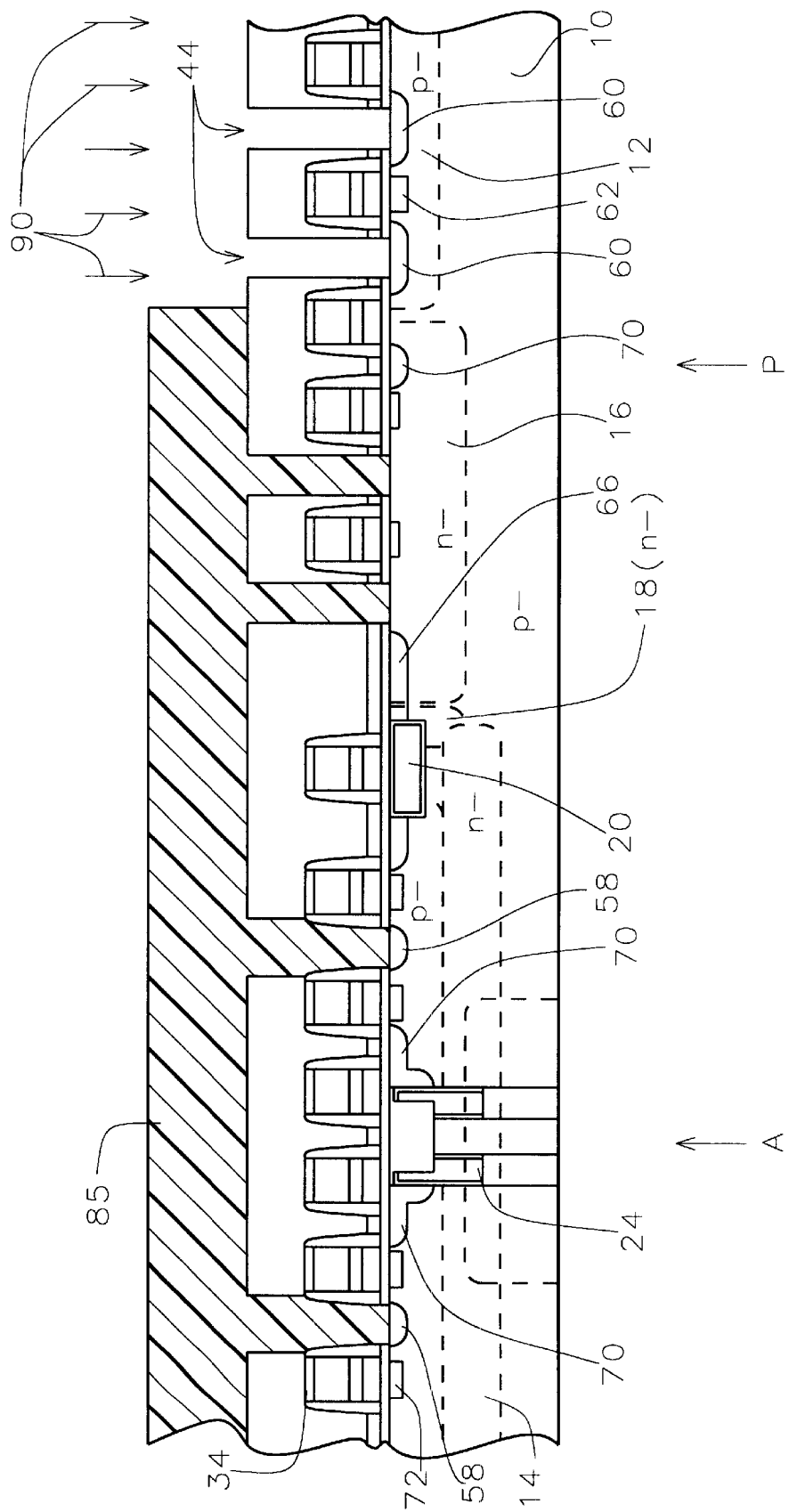

Referring now to FIG. 5, the mask 75 is removed and another mask 85 is formed to expose a portion of the periphery area P. Plasma doping 90 is performed. A plasma of dopant gases is generated. NFET contact junctions 60 are formed by doping with arsenic or phosphorus at a dosage of greater than $3 E 15$ ions/cm$^2$ and an energy of less than 10 KeV. The other plasma doping process parameters are the same as in the first step above.

Figure 6:
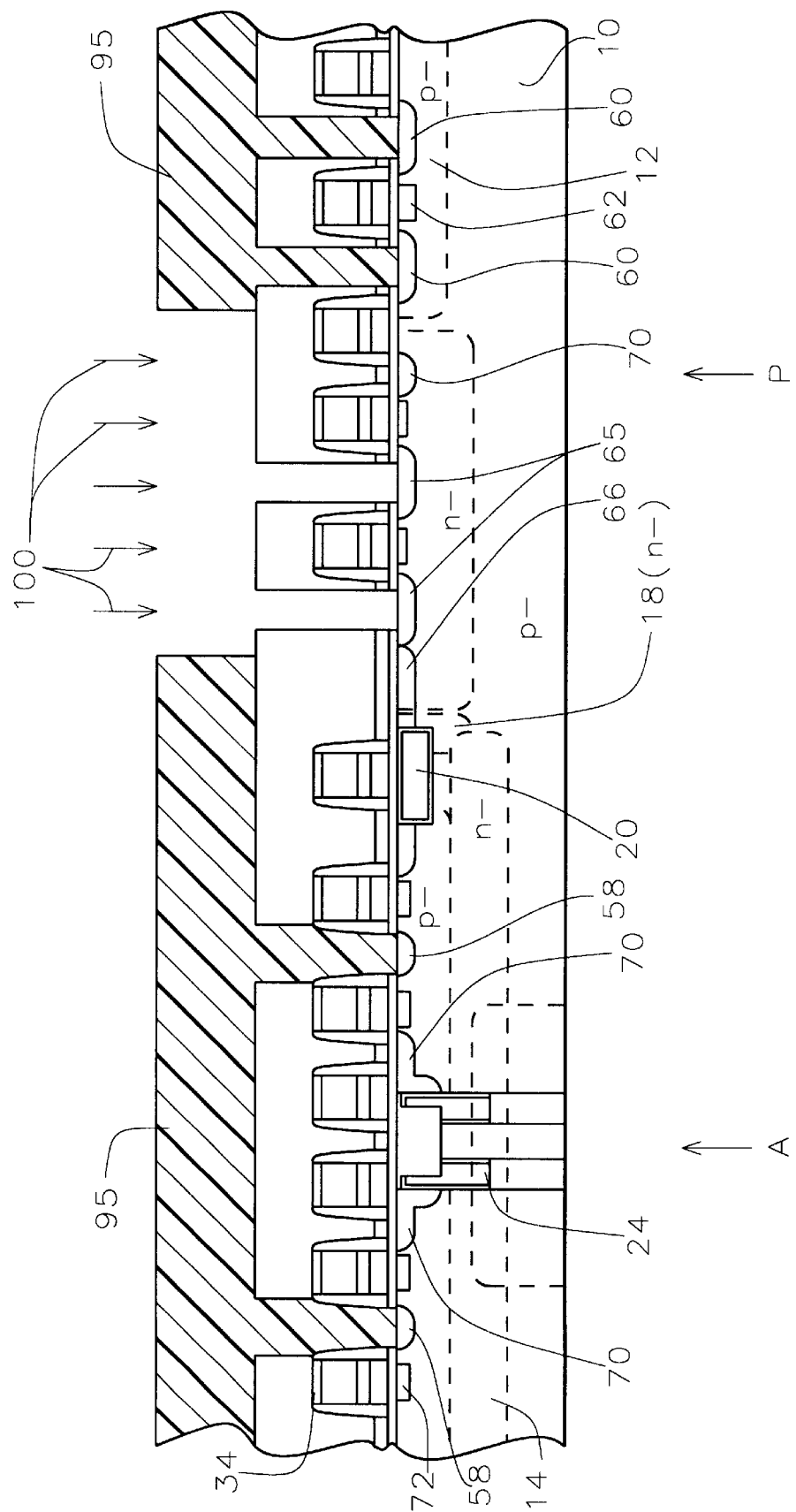

Referring now to FIG. 6, the mask 85 is removed and another mask 95 is formed to expose the PFET portion of the periphery area P. Plasma doping 100 is performed. A plasma of dopant gases is generated. PFET contact junctions 65 are formed by doping with boron at a dosage of greater than 1 E 15 ions/cm² and an energy of less than 10 KeV. The other plasma doping process parameters are the same as in the first step above. In many cases, the PFET implantation step (CSP) is not done to prevent excess boron outdiffusion. However, future devices will require CSP. Either an implant junction (as described above) or a diffusion junction can be used to form PFET contact junctions 65.

Figure 7:
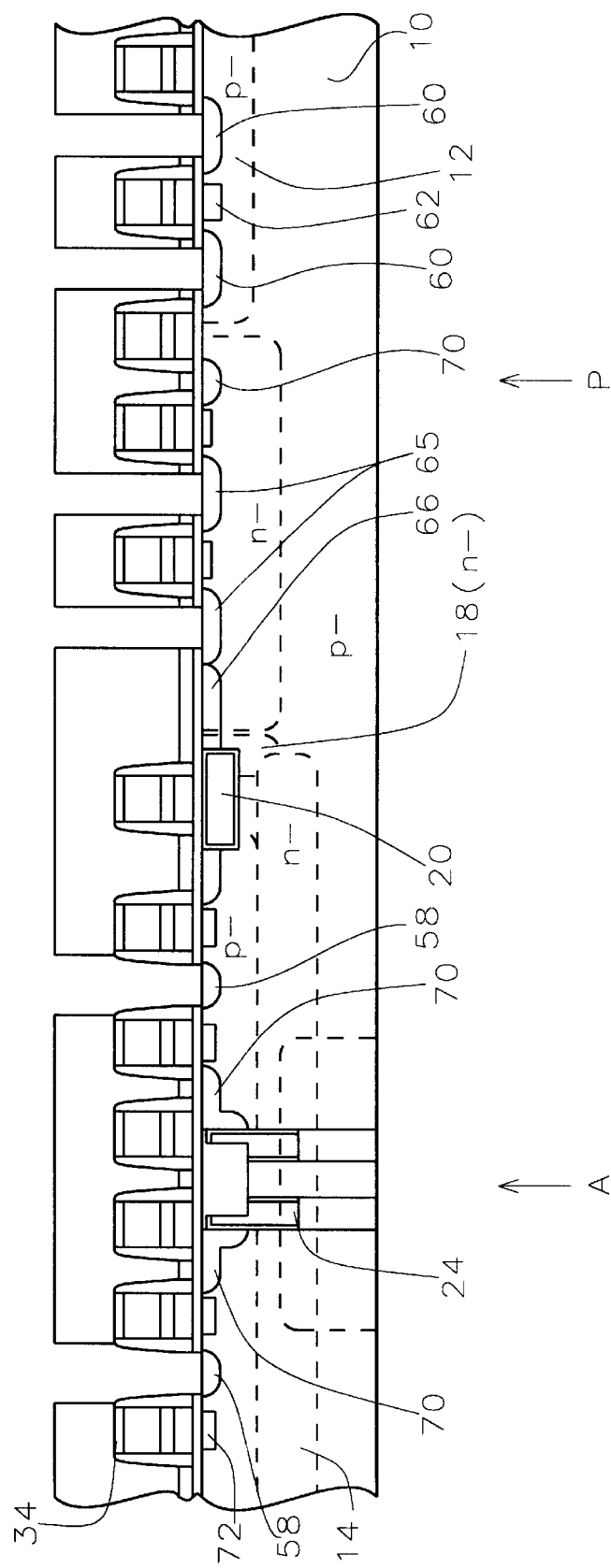

Referring now to FIG. 7, the mask 95 is removed. Annealing is performed such as by a rapid thermal process (RTP) and furnace annealing to drive in the contact junctions 58, 60, and 65. The wafer is cleaned, for example, using a conventional wet cleaning process.

Figure 8:
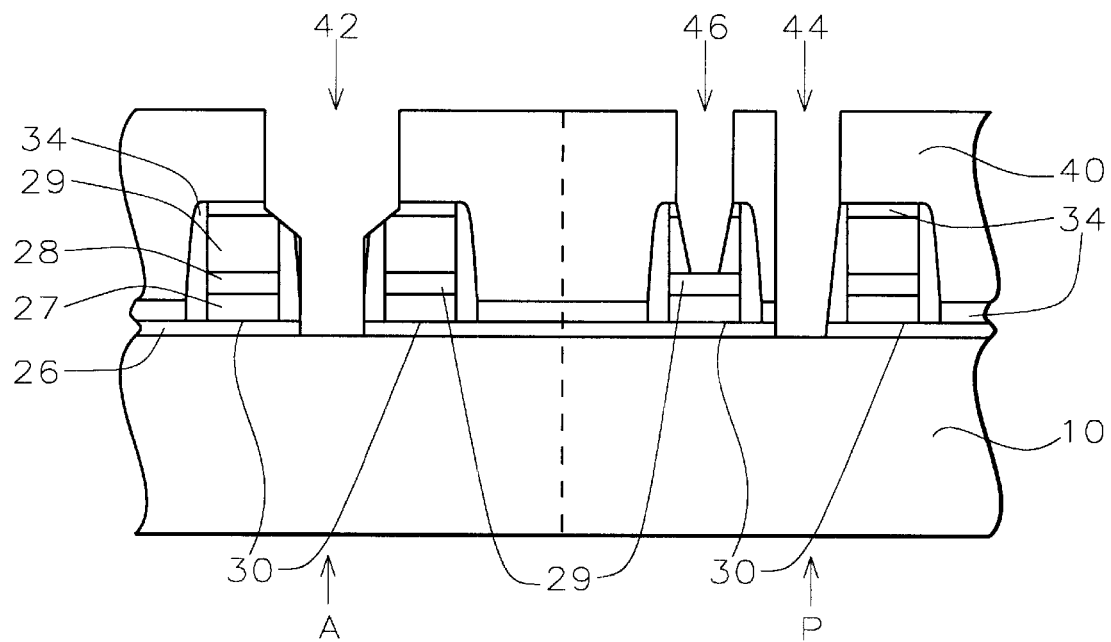

Now, the separate gate contact etch is to be performed. Referring now to FIG. 8 in the close-up view, the gate contact opening 46 is etched having a high selectivity to the silicide material in layer 29. The contact to gate etch is now a less critical etch. CF4, CHF3, 02 and Ar gases may be used for the oxide etch. Endpoint detection can now be used for its homogeneous structure to stop on top of the cap nitride layer 34. Then, the cap nitride etch can be optimized to render a high selectivity to tungsten silicide (layer 28) by using CH2F2 or CHF3 gases.

Figure 9:
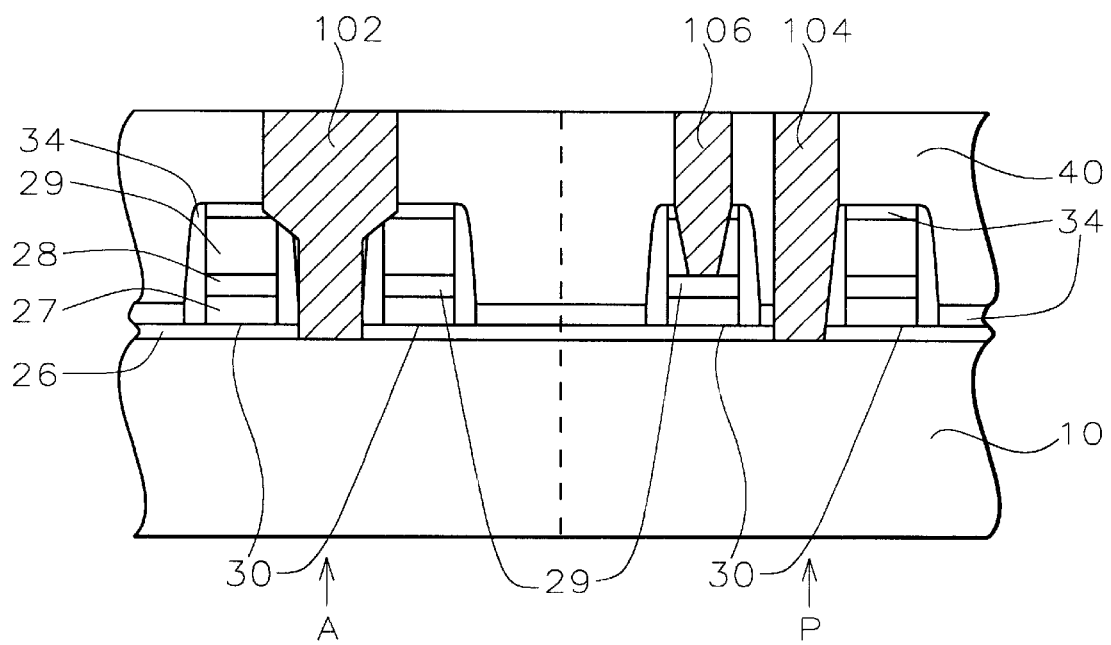
Figure 10:
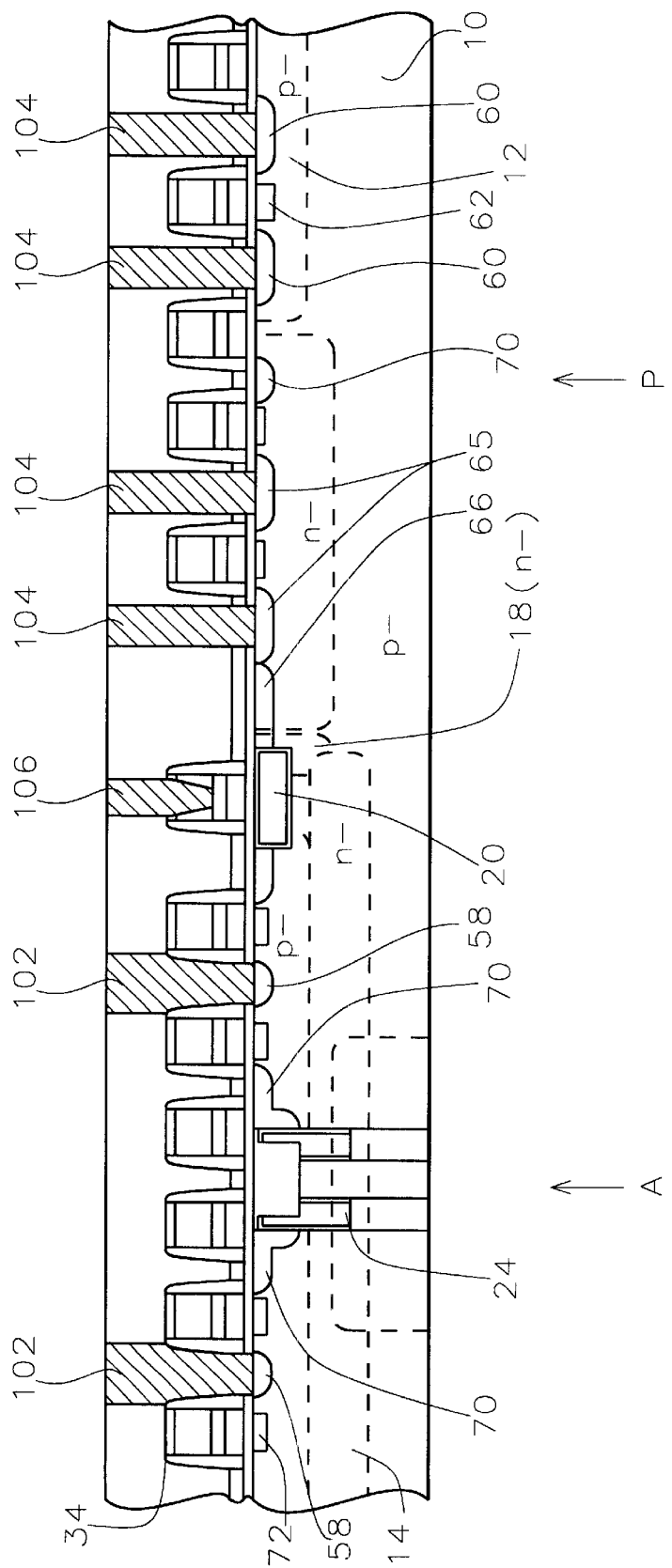

Referring now to FIG. 9, the contacts CS, CB, and CG are completed by filling the contact openings 42, 44, and 46 (shown in FIG. 8) with a metal layer. Typically, a barrier metal layer, not shown, such as titanium/titanium nitride or other glue layer and barrier layer, is deposited within the contact openings. Then, a metal layer such as tungsten is deposited and planarized to leave metal plugs 102, 104, and 106. The completed contacts are shown in expanded view in FIG. 10.

Processing continues as is conventional in the art with higher levels of metallization. The process of the present invention provides a combined etching scheme which makes it possible to optimize both CS/CB and CG without adversely interfering with each other. It can be implemented simply without additional tools or process development. In addition, the plasma doping scheme of the present invention, in combination with the new etching scheme, results in low resistance shallow junctions and increased throughput. The process of the present invention is extendible to metal gates or dual work function gates.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts in the fabrication of a DRAM integrated circuit comprising:
    providing semiconductor device structures in and on a substrate wherein said substrate is divided into an array area and a periphery area;
    covering said semiconductor device structures with a dielectric layer;
    concurrently etching through said dielectric layer in said array area to form bit line contact openings and etching through said dielectric layer in said periphery area to form substrate contact openings;
    thereafter etching through said dielectric layer to form a gate contact opening; and filling said bit line contact openings, said substrate contact openings, and said gate contact opening with a conducting layer to complete said forming contacts in the fabrication of said DRAM integrated circuit device.

2. The method according to claim 1 wherein said semiconductor device structures include gate electrodes and source and drain regions.

3. The method according to claim 1 further comprising forming deep trench DRAM devices in said substrate.

4. The method according to claim 1 wherein said dielectric layer comprises one or more of the group containing silicon dioxide, borophosphotetraethoxysilane oxide, borophosphosilicate glass, and phosphosilicate glass.

5. The method according to claim 1 wherein said dielectric layer has a thickness of between about 6000 and 10,000 Angstroms.

6. The method according to claim 1 wherein said step of etching to form said bit line contact-openings and said substrate contact openings is a self-aligned contact etch.

7. The method according to claim 1 further comprising forming doped regions in said substrate exposed within said bit line contact openings and said substrate contact openings using a plasma doping process.

8. The method according to claim 7 wherein said step of forming doped regions in said substrate exposed within said bit line contact openings and said substrate contact openings using a plasma doping process comprises:
    shielding said periphery area and plasma doping said substrate underlying said bit line contact openings to form NFET bit line contact junctions;
    shielding s aid array area and a portion of said periphery area and plasma doping said substrate underlying said substrate contact openings not shielded to form NFET substrate contact junctions; and
    shielding said array area and another portion of said periphery area and plasma doping said substrate underlying said substrate contact openings not shielded to form PFET substrate contact junctions.

9. A method of forming contacts in the fabrication of a DRAM integrated circuit comprising:
    providing semiconductor device structures in and on a substrate wherein said substrate is divided into an array area and a periphery area;
    covering said semiconductor device structures with a dielectric layer;
    concurrently etching through said dielectric layer in said array area to form bit line contact openings and etching through said dielectric layer in said periphery area to form substrate contact openings;
    forming doped regions in said substrate exposed within said bit line contact openings and said substrate contact openings using a plasma doping process;
    thereafter etching through said dielectric layer to form a gate contact opening; and
    filling said bit line contact openings, said substrate contact openings, and said gate contact opening with a conducting layer to complete said forming contacts in the fabrication of said DRAM integrated circuit device.

10. The method according to claim 9 wherein said semiconductor device structures include gate electrodes and source and drain regions.

11. The method according to claim 9 further comprising forming deep trench DRAM devices in said substrate.

12. The method according to claim 9 wherein said dielectric layer comprises one or more selected from the group consisting of: silicon dioxide, borophosphotetraethoxysilane oxide, borophosphosilicate glass, and phosphosilicate glass.

13. The method according to claim 9 wherein said dielectric layer has a thickness of between about 6000 and 10,000 Angstroms.

14. The method according to claim 9 wherein said step of etching to form said bit line contact openings and said substrate contact openings is a self-aligned contact etch.

15. The method according to claim 9 wherein said step of forming doped regions in said substrate exposed within said bit line contact openings and said substrate contact openings using a plasma doping process comprises:

shielding said periphery area and plasma doping said substrate underlying said bit line contact openings to form NFET bit line contact junctions;

shielding said array area and a portion of said periphery area and plasma doping said substrate underlying said substrate contact openings not shielded to form NFET substrate contact junctions; and shielding said array area and another portion of said periphery area and plasma doping said substrate underlying said substrate contact openings not shielded to form PFET substrate contact junctions.

16. The method according to claim 9 wherein said plasma doping process comprises a high dosage of 1 E 14 to 1 E 16 ions/cm$^2$ and a low energy of 100 eV to 10 KeV.

17. The method according to claim 16 wherein said plasma doping process further comprises a low temperature of between about 25 and 100 oC, dosage control by pulse engineering, and high throughput of more than 60 wafers per hour.

18. A method of forming contacts in the fabrication of a DRAM integrated circuit comprising:

providing semiconductor device structures in and on a substrate wherein-said substrate is divided into an array area and a periphery area;

covering said semiconductor device structures with a dielectric layer;

concurrently etching through said dielectric layer in said array area to form bit line contact openings and etching through said dielectric layer in said periphery area to form substrate contact openings using a self-aligned contact etching process;

forming doped regions in said substrate exposed within said bit line contact openings and said substrate contact openings using a plasma doping process;

thereafter etching through said dielectric layer to form a gate contact opening; and filling said bit line contact openings, said substrate contact openings, and said gate contact opening with a conducting layer to complete said forming contacts in the fabrication of said DRAM integrated circuit device.

19. The method according to claim 18 wherein said semiconductor device structures include gate electrodes and source and drain regions.

20. The method according to claim 18 further comprising forming deep trench DRAM devices in said substrate.

21. The method according to claim 18 wherein said dielectric layer comprises one or more selected from the group consisting of: silicon dioxide, borophosphotetraethoxysilane oxide, borophosphosilicate glass, and phosphosilicate glass.

22. The method according to claim 18 wherein said dielectric layer has a thickness of between about 6000 and 10,000 Angstroms.

23. The method according to claim 18 wherein said step of forming doped regions in said substrate exposed within said bit line contact openings and said substrate contact openings using a plasma doping process comprises:

shielding said periphery area and plasma doping said substrate underlying said bit line contact openings to form NFET bit line contact junctions;

shielding said array area and a portion of said periphery area and plasma doping said substrate underlying said substrate contact openings not shielded to form NFET substrate contact junctions; and shielding said array area and another portion of said periphery area and plasma doping said substrate underlying said substrate contact openings not shielded to form PFET substrate contact junctions.

24. The method according to claim 18 wherein said plasma doping process comprises a high dosage of 1 E 14 to 1 E 16 ions/cm$^2$ and a low energy of 100 eV to 10 KeV.

25. The method according to claim 18 wherein said plasma doping process further comprises a low temperature of between about 25 and 100 oC, dosage control by pulse engineering, and high throughput of more than 60 wafers per minute.

* * * * *